United States Patent [19]

van de Plassche

[11] 4,300,103

[45] Nov. 10, 1981

[54] PUSH-PULL AMPLIFIER

[75] Inventor: Rudy J. van de Plassche, Eindhoven, Netherlands

[73] Assignee: U.S. Philips Corporation, New York, N.Y.

[21] Appl. No.: 84,042

[22] Filed: Oct. 12, 1979

[30] Foreign Application Priority Data

Oct. 30, 1978 [NL] Netherlands .................. 7810772

[51] Int. Cl.³ .............................................. H03F 3/30
[52] U.S. Cl. ................................... 330/274; 330/272
[58] Field of Search ....................... 330/273, 274, 272

[56] References Cited

U.S. PATENT DOCUMENTS 3,855,540 12/1974 Leidich .............................. 330/273

Primary Examiner—James B. Mullins

Attorney, Agent, or Firm—Thomas A. Briody; William J. Streeter; Edward W. Goodman

[57] ABSTRACT

A push-pull amplifier, having a first and a second transistor of the same conductivity type, whose collector-emitter paths are included in series between two power-supply terminals, the emitter electrode of the first transistor being connected to the collector electrode of the second transistor and to an output terminal, and the base electrode of the first transistor being connected to an input terminal, is improved in respect of its linearity, temperature dependence and bandwidth by measuring the base-emitter voltage of the first transistor with the aid of a series connection of a semiconductor junction and a resistor and by applying said voltage with opposite a.c. component to the base-emitter junction of the second transistor via a coupling circuit.

9 Claims, 6 Drawing Figures

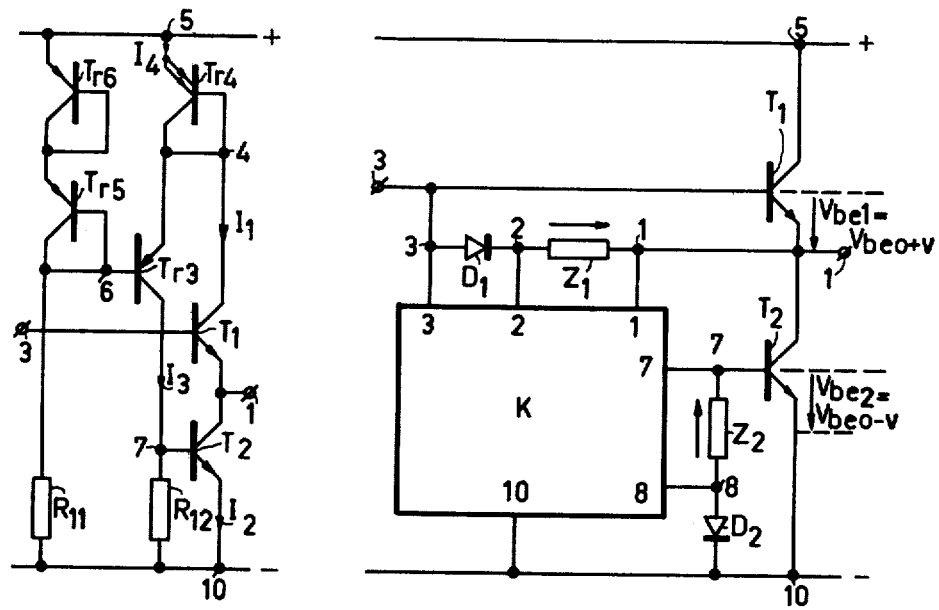
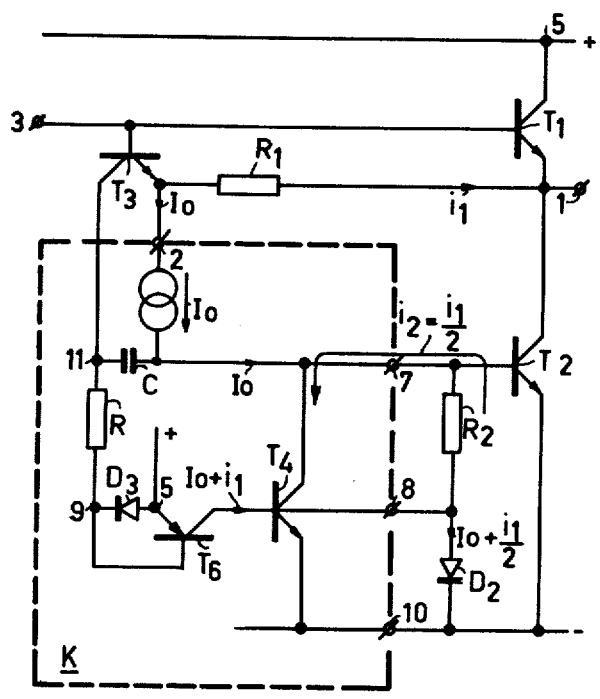
FIG.1  FIG.2
FIG.3

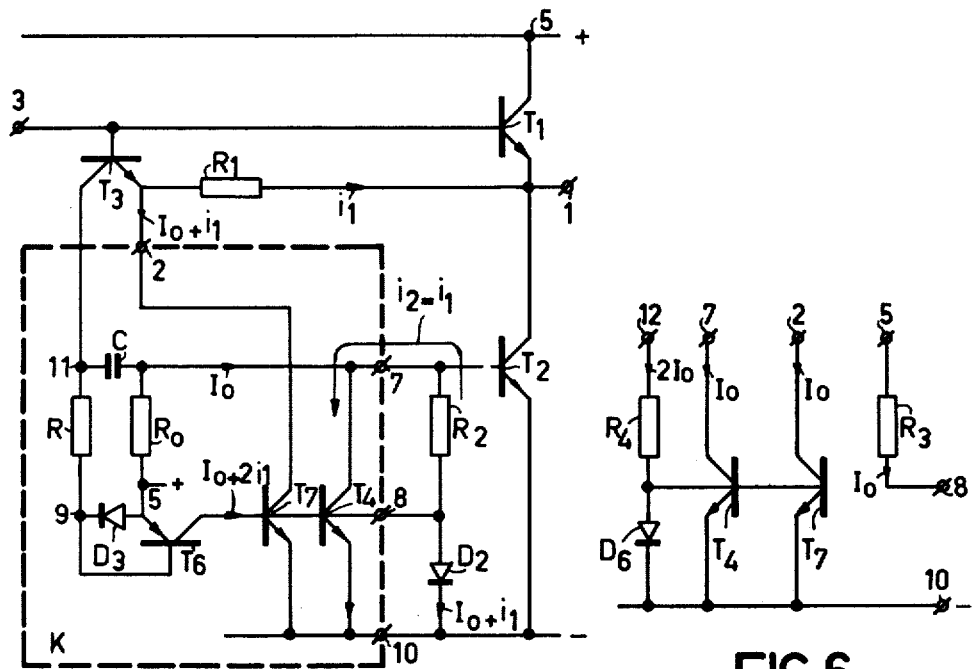
FIG.4
FIG.6
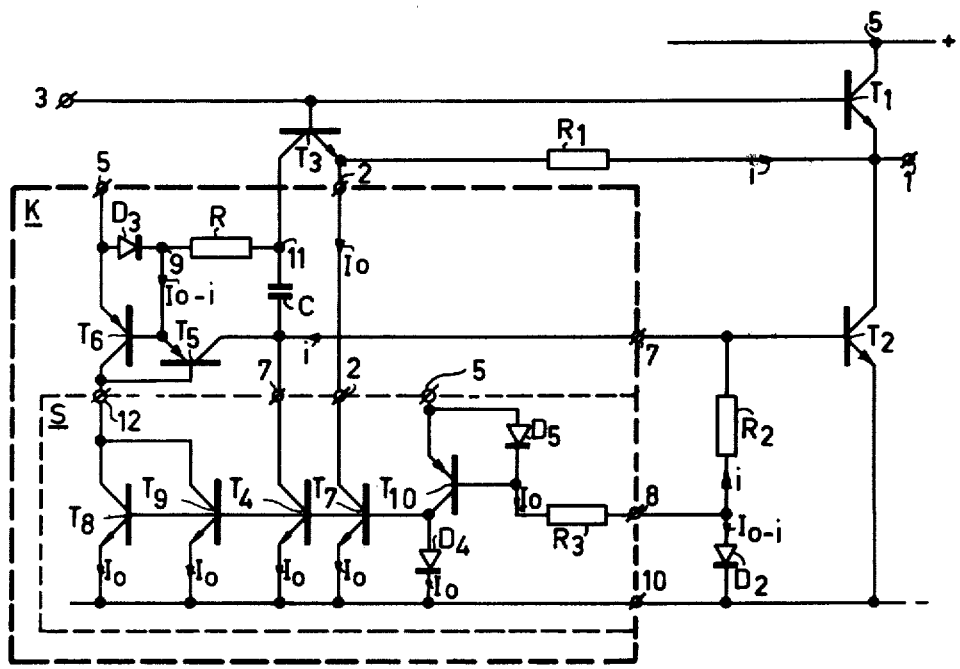
FIG.5

PUSH-PULL AMPLIFIER

BACKGROUND OF THE INVENTION

The invention relates to a push-pull amplifier comprising a first and a second transistor of the same conductivity type, whose collector-emitter paths are included in series between power-supply terminals, the emitter electrode of the first transistor being connected to the collector electrode of the second transistor and to an output terminal, the base electrode of the first transistor being connected to an input terminal, and means being provided for driving the second transistor as a function of the drive of the first transistor.

Modern integrated wide-band amplifiers preferably use transistors of the same conductivity type for the transistors in the push-pull output stage, because in this case, in contradistinction to a so-called "complementary" output stage, satisfactory high-frequency characteristics and high gain-factors are attainable. Such a circuit arrangement is described in "Electronic Letters" Vol. 10, No. 15 to 25 July 1974 on pages 317, 318 and 319.

In order to enable the second transistor in this arrangement to be driven in a suitable manner, the collector circuit of the first transistor includes a diode in the forward direction. The voltage across this diode, which is a measure of the current through the first transistor is converted, via a third transistor which operates in common-base arrangement and which is of a conductivity type opposite to that of the output transistors, into a corresponding current of opposite phase through a resistor in parallel with the base-emitter junction of the second transistor. As a result of this the current through the second transistor will be in phase opposition to that through the first transistor. Moreover, in the case of sufficiently small currents through the third transistor, current is sustained in the output transistors, which is favorable for a satisfactory take-over behavior. However, the transfer is not satisfactorily linear because of the asymmetry of the arrangement, the finite currents through the third transistor, and the drive of the second transistor via a second resistor. This resistor and the deviating conductivity type of the third transistor also give rise to temperature dependence of the bias currents.

SUMMARY OF THE INVENTION

It is an object of the invention to provide a push-pull amplifier of the type mentioned in the preamble, which does not have the said drawbacks and to this end the invention is characterized in that the second transistor driving means comprises: a measuring circuit between the base and the emitter electrode of the first transistor, which measuring circuit includes a series connection of a first semiconductor junction and a first impedance, a control circuit between the base and the emitter electrode of the second transistor, which control circuit includes a series connection of a second semiconductor junction and second impedance, a current-source circuit for providing the quiescent current through the first and the second semiconductor junctions, and a coupling circuit for adapting the currents through the control circuit to those through the measuring circuit in such a way that, in the case of a normal drive on the input terminal, the sum of the base-emitter voltages of the first and the second, transistors remains substantially constant.

For obtaining a constant sum of the base-emitter voltages of the output transistors (necessary for a satisfactory take-over behavior of the output transistors) a series connection of a diode and an impedance, preferably a resistor, is included between the base and the emitter electrode of these two transistors. If the same bias currents are passed through the two diodes, which are connected in the forward direction, which currents are proportioned so that at rest no currents flow through the impedances which take the form of resistors, an alternating current will flow through the associated resistor if the base of one of the transistors is driven. If by means of a coupling circuit this alternating current is now applied in phase opposition to the other resistor, whose value has been adapted, the a.c. component in the base-emitter voltage of the associated transistor will also be in phase opposition to that of the other transistor, so that the desired object is achieved. Moreover, the diodes in the measuring and control circuits render the quiescent-current setting of the push-pull amplifier temperature insensitive, because the quiescent currents through the output transistors are determined only by the bias currents through the diodes.

An optimum measurement and transfer of the signal current by the measuring circuit is achieved if the first semiconductor junction is the base-emitter junction of a third transistor, whose emitter is connected to the current source circuit and whose collector is connected to an input of the coupling circuit. This third transistor is preferably of the same conductivity type as that of the output transistors. Furthermore, it is favorable if the coupling circuit comprises a current amplifier having an input current circuit and an output current circuit, the input circuit being included in the collector circuit of the third transistor and the output current circuit being connected to the control circuit. For transferring the signal current from the measuring circuit to the control circuit it is advantageous that the coupling circuit comprises a current mirror having an input and an output, of which the input is connected to the collector of the third transistor and of which the output is connected to the base of a fourth transistor, the second semiconductor junction being connected in parallel with the base-emitter junction of the fourth transistor and the second impedance being included between the base and the collector electrode of the fourth transistor, whose collector is also connected to the current source circuit. When further elaborating the circuit arrangement, it is first of all convenient if the current source circuit comprises a current source between the emitter of the third transistor and the collector of the fourth transistor. Such a current source may not only be realized in a conventional manner, but also in a special manner, the current source circuit comprising a transistor, whose collector is connected to the emitter of the third transistor and whose base-emitter junction is connected parallel to the base-emitter junction of the fourth transistor, and a resistor which connects the collector of the fourth transistor to the positive supply voltage terminal. However, designing a current source circuit in this way results in feedback from the control circuit to the measuring circuit. In order to avoid this feedback, the coupling circuit has to become slightly more intricate, i.e. such that the current amplifier comprises a current mirror having an input and an output, a fifth transistor, whose emitter is connected to the input of the current mirror, whose base is connected to the output of the current mirror, and whose collector is connected to the measuring circuit, and a current source circuit for the quiescent currents through the current mirror. Furthermore, in the measuring circuit the second semiconductor junction is included between the second impedance and the emitter of the second transistor, the connection point of the second impedance and the second semiconductor junction is connected to a current source for the quiescent current through the second semiconductor junction, and the base of the second transistor is connected to the collector of the fifth transistor and a current source. For a further improvement of the high-frequency behavior of the push-pull amplifier, the collector of the third transistor should be connected both to the input of the coupling circuit via a resistor and to the base of the second transistor via a capacitor. For high frequencies the signal from the measuring circuit then no longer passes to the control circuit through the coupling circuit, but directly via the coupling capacitor. Less than satisfactory high-frequency characteristics of the coupling circuit are then avoided.

DESCRIPTION OF THE DRAWINGS

The invention will be described in more detail with reference to the following Figures.

FIG. 1 shows the diagram of a known push-pull amplifier comprising two npn-transistors.

FIG. 2 schematically represents the push-pull amplifier in accordance with the invention.

FIG. 3 shows a simple embodiment of the push-pull amplifier in accordance with the invention.

FIG. 4 is the diagram of a preferred embodiment of the push-pull amplifier in accordance with the invention.

FIG. 5 shows another embodiment of the push-pull amplifier in accordance with the invention.

FIG. 6 shows how the current-source circuit of FIG. 5 may be simplified.

DESCRIPTION OF THE PREFERED EMBODIMENTS

In the various FIGURES, $T_1$ and $T_2$ are the two npn-transistors of a push-pull amplifier, whose output 1 is connected both to the emitter of the first transistor $T_1$ and to the collector of the second transistor $T_2$, and whose input 3 is connected to the base of the first transistor $T_1$. The positive and the negative voltage terminals (5 and 10, respectively) are coupled to the collector of the first transistor $T_1$ and the emitter of the second transistor $T_2$, respectively. The first transistor $T_1$ is employed as an emitter-follower for the input signal, while the second transistor $T_2$ is used as a variable current source, which is controlled by a control signal derived from the input signal, in such a way that the sum of the base-emitter voltages $V_{be1}+V_{be2}$ of the two transistors $T_1$ and $T_2$ remains virtually constant.

A known manner of realizing this is shown in FIG. 1. In this circuit arrangement the collector of the first transistor $T_1$ (point 4) is not connected directly to the positive supply voltage terminal 5, but via a pnp-transistor $T_{r4}$, which is connected as a diode in the forward direction. The pnp-transistors $T_{r5}$ and $T_{r6}$ are also connected as diodes in the forward direction. They are both connected in series, the emitter of the sixth transistor $T_{r6}$ being connected to the positive supply voltage terminal 5 and the connection point 6 of the base electrode of the fifth transistor $T_{r5}$ and the collector electrode of the same transistor being connected to the negative supply voltage terminal 10 via a resistor $R_{11}$. Thus a reference voltage source is obtained between point 6 and point 5. If point 4 is now connected to the emitter of a pnp-transistor $T_{r3}$, whose base is maintained at a constant potential by connecting it to point 6, then, as the base-emitter voltage $V_{be1}$ of the first transistor $T_1$ for example decreases, the collector current through the same transistor $T_1$ and thus the voltage across the diode $T_{r4}$ will also decrease, whereas the voltage across the base-emitter junction of the third transistor $T_{r3}$ will increase, which results in an increasing collector current through said transistor $T_{r3}$. The voltage across a collector resistor $R_{12}$ included in the collector circuit of said transistor $T_{r3}$ then also increases and so does the voltage $V_{be2}$ across the base-emitter junction of the second transistor $T_2$, which is connected in parallel with the resistor $R_{12}$. Thus, a decrease of the base-emitter voltage $V_{be1}$ of the first transistor $T_1$ ultimately results in an increase of the base-emitter voltage $V_{be2}$ of the second transistor $T_2$, so that the sum of the said base-emitter voltages $V_{be1}+V_{be2}$ remains approximately constant. On further consideration it is found that only if the current $I_3$ through the third transistor $T_{r3}$ is negligible relative to that through the output transistors $T_1$ and $T_2$ and thus also relative to the current $I_4$ through the fourth transistor $T_{r4}$, the product of the current through the output transistors, $I_1 \cdot I_2$, and thus the sum of the base emitter voltages $V_{be1}+V_{be2}$ of the output transistors $T_1$ and $T_2$ is virtually constant. However, in practice it is found to be difficult to ensure that said requirement of a small current $I_3$ through the third transistor $T_{r3}$ is constantly met, especially because this current must also flow through the resistor $R_{12}$ for a substantial part. Moreover, the transistors $T_{r3}$ through $T_{r6}$ are of a conductivity type opposite to that of the output transistors $T_1$ and $T_2$, so that the frequency and temperature behavior of the push-pull amplifier is adversely effected and the arrangement of FIG. 1 may only be considered as a first approximation in order to attain the desired object.

FIG. 2 represents the inventive principle. In this circuit arrangement a measuring circuit comprising a series connection of an impedance $Z_1$ and a diode $D_1$ in the forward direction is included between the base electrode 3 and the emitter electrode 1 of the first transistor $T_1$ and a control circuit comprising a series connection of an impedance $Z_2$ and a diode $D_2$ in the forward direction between the base electrode 7 and the emitter electrode 10 of the second transistor $T_2$. The diodes $D_1$ and $D_2$ are biased by a specific current $I_O$, in such a way that no currents flow through the impedances $Z_1$ and $Z_2$ in the rest condition. If the base 3 of the first transistor $T_1$ is now driven, a certain signal current will flow through the measuring circuit $D_1$-$Z_1$, which signal current is applied in phase opposition to the control circuit $D_2$-$Z_2$ by a coupling circuit K. If the value of the second impedance $Z_2$ is now selected so that the a.c. component across the control circuit, i.e. also across the base-emitter junction of the second transistor $T_2$, is and remains equal but opposite to that across the measuring circuit, i.e. also across the base-emitter junction of the first transistor $T_1$, the sum of the base-emitter voltage $V_{be1}+V_{be2}$ of the output transistors $T_1$ and $T_2$ will continuously remain constant regardlesss of temperature or frequency, so that the object is achieved. If the impedances $Z_1$ and $Z_2$ take the form of resistors $R_1$ and $R_2$, as is common practice, a possible difference in quiescent voltage across the diodes $D_1$ and $D_2$ and the base-emitter voltages of the output transistors $T_1$ and $T_2$ should be compensated for by a quiescent current through the resistors $R_1$ and $R_2$.

Although there are various manners of realizing the coupling circuit K, as for example by maintaining the alternating voltages v across the impedances $Z_1$ and $Z_2$ equal but in phase opposition by means of a control circuit at equal quiescent voltages across the diodes $D_1$ and $D_2$, the embodiments of the push-pull amplifier in accordance with the invention shown in FIGS. 3, 4 and 5 are preferred, in which embodiments the signal current $i_1$ and the quiescent current $I_o$ in the measuring circuit are coupled out by means of a third npn transistor $T_3$. These currents are then available on the collector of the third transistor $T_3$, while the base-emitter junction of this transistor $T_3$ may take the place of the first diode $D_1$ and the first impedance $Z_1$ has been replaced by a resistor $R_1$. For the coupling circuit K, the connection 1 may then be eliminated.

FIGS. 3 to 6 show four preferred embodiments of the push-pull amplifier in accordance with the invention, corresponding elements bearing the same reference numerals and letters.

FIG. 3 represents a very simple embodiment of the invention. In this embodiment the collector 11 of the third transistor $T_3$ is both connected to the positive supply voltage terminal 5 via a resistor R, which is connected to the input 9 of a first current mirror constituted by a third diode $D_3$ and a pnp transistor $T_6$, and to the first output 7 of the coupling circuit K via a coupling capacitor C. The output 8 of the first current mirror $D_3$-$T_6$, constituted by the collector 8 of the sixth transistor $T_6$, is both connected to the base 8 of a fourth npn-transistor $T_4$ and to the second output 8 of the coupling circuit K. The first output 7 of the coupling circuit K is connected to the collector of the fourth transistor $T_4$, while the emitter of said transistor $T_4$ is connected to the negative supply voltage terminal 10. Finally, a direct current source $I_o$ for biasing both the third and the fourth transistors $T_3$ and $T_4$ is included between the emitter 2 of the third transistor $T_3$ which is connected to the second input 2 of the coupling circuit K, and the collector 7 of the fourth transistor $T_4$, which is connected to the first output 7 of the coupling circuit K, while the first current mirror $D_3$-$T_6$ supplies the bias current $I_o$ for the second semiconductor junction $D_2$.

The operation of the circuit arrangement just described is as follows. In the third transistor $T_3$ the bias current $I_o$ applied to the emitter 2 is added to the signal current $i_1$ through the first resistor $R_1$ and is thus available on the collector 11 as a sum current $I_o+i_1$. Via the resistor R this current is now mirror-inverted relative to the positive supply voltage terminal 5 in the first current mirror $D_3$-$T_6$ after which it appears again on the collector of the sixth transistor $T_6$, so as to drive a second current mirror $D_2$-$T_4$, constituted by the second semiconductor junction $D_2$ of the control circuit and the fourth transistor $T_4$, relative to the negative supply voltage terminal 10. By including the second impedance $Z_2$, constituted by the second resistor $R_2$ of the control circuit, between the input 8 and the output 7 of said second current mirror $D_2$-$T_4$ and supplying the collector of the fourth transistor $T_4$ from a bias current source $I_o$, only half the signal current $\frac{1}{2}$ from the first resistor $R_1$ will flow through the second resistor $R_2$. If the values of the first and the second resistors are $R_1$ and $R_2$ respectively, and the values of the differential resistances of both the first and the second semiconductor junctions $D_1$ and $D_2$ are r, it follows from FIG. 3 that the value of the second resistor $R_2$ should be $R_2=2R_1+3r$ in order to obtain equal alternating voltage components $v=i_1(r+R_1)$ of opposite phase across the measuring and control circuits. The resistor R and the capacitor C constitute a frequency-dependent junction. As a result of this, low-frequency signals in the collector current of the third transistor $T_3$ pass through the entire coupling circuit K via the resistor R, while high-frequency signals bypass the actual coupling circuit K via the capacitor C so as to arrive directly at the base 7 of the second transistor $T_2$. Thus, a less satisfactory transfer of high-frequency signals by the coupling circuit K, for example by the pnp-transistor $T_6$ of the first current mirror $D_3$-$T_6$, no longer plays a part. In this way the push-pull amplifier will retain its favorable properties, at very high frequencies.

FIG. 4 shows how the current source $I_0$, which in FIG. 3 is included between the emitter 2 of the third transistor $T_3$ and the collector 7 of the fourth transistor $T_4$, is realized in the preferred embodiment. For this purpose said current source $I_0$ is divided into two sections, namely one section which supplies the collector quiescent current to the fourth transistor $T_4$ and which simply comprises a resistor $R_0$ which connects the collector 7 of the fourth transistor $T_4$ to the positive supply voltage terminal 5, and a section which supplies the bias current $I_0$ to the emitter 2 of the third transistor $T_3$. This last-mentioned current is supplied by the collector of a seventh (npn) transistor $T_7$, whose base-emitter junction is connected in parallel with that of the fourth transistor $T_4$. The quiescent current $I_0+i_1$ supplied to the emitter 2 of the third transistor $T_3$ consequently also contains an a.c. component $i_1$, so that effective negative feedback is obtained and the values of the second resistor $R_2$ may be substantially equal to that of the first resistor $R_1$, or more exactly: $R_2=R_1+3r$, yielding an improved symmetry of the circuit.

FIG. 5 shows a variant to the circuit of FIG. 3. The extension is that between the input 9 and the output 12 of the first current mirror $D_3$-$T_6$, the base-emitter junction of a fifth pnp transistor $T_5$ is included in such a way that the emitter of the fifth transistor $T_5$ is connected to the input 9 of the first current mirror $D_3$-$T_6$ and the base of the fifth transistor is connected both to the output 12 of the first current mirror $D_3$-$T_6$ and to a current source $2I_0$, constituted by the collectors of an eighth and a ninth npn-transistor, $T_8$ and $T_9$. The collector of the fifth transistor $T_5$, together with the collector of the fourth transistor $T_4$ and the coupling capacitor C, constitutes the first output 7 of the coupling circuit K. The current source, which supplies the emitter 2 of the third transistor $T_3$, is constituted by the collector of the seventh transistor $T_7$. In parallel with the base-emitter junctions of the transistors ($T_4$, $T_7$, $T_8$, $T_9$), which function as current sources, a fourth diode $D_4$ is included, whose cathode is connected to the negative supply voltage terminal 10 and whose anode is connected to the output of a third current mirror $D_5$-$T_{10}$ comprising a tenth (pnp) transistor $T_{10}$, whose collector constitutes the output of the current mirror, and a fifth diode $D_5$, whose anode is connected to the positive supply voltage terminal 5 and which is connected in parallel with the base-emitter junction of the tenth transistor $T_{10}$. The input of the third current mirror $D_5$-$T_{10}$, constituted by the cathode of the fifth diode $D_5$ and the base of the tenth transistor $T_{10}$, is connected to the second output 8 of the coupling circuit K via a resistor $R_3$. As a result of this a quiescent current $I_0$, which is determined by the value of the third resistor $R_3$, flows through the third resistor $R_3$ and thus through the second and the fourth diodes $D_2$ and $D_4$ and through the transistors $T_4$, $T_7$, $T_8$ and $T_9$ of the current-source circuit S. For the same bias currents $I_0$ in FIGS. 4 and 5, the values of the bias resistors $R_0$ and $R_3$ should also be substantially equal.

Again the high-frequency alternating currents bypass the coupling circuit K via the coupling capacitor C, while the low-frequency signals again reach the first current mirror $D_3$-$T_6$ via the resistor R. By the inclusion of the fifth transistor $T_5$ between the input and the output of the first current mirror $D_3$-$T_6$, a current $I_0-i$ is now available on the collector of said transistor $T_5$, which has the same quiescent current component $I_0$ as the collector current $I_0+i$ of the third transistor $T_3$, but which contains the a.c. component i, which also passes through the first resistor $R_1$, in phase opposition. If by means of the current source $I_0$, constituted by the collector of the fourth transistor $T_4$, the d.c. component $I_0$ in the collector current $I_0-i$ of the fifth transistor $T_5$ is drained, only the a.c. component i will flow through the first output 7 of the coupling circuit K. At negligible base currents through the second transistor $T_2$, the same alternating current i as through the first resistor $R_1$ will then flow through the second resistor $R_2$. For a constant sum of the base-emitter voltages $V_{be1}+V_{be2}$ of the output transistors $T_1$ and $T_2$, the value of the second resistor $R_2$ should therefore be equal to that of the first resistor $R_1$, regardless of the value of the differential resistances of the first and the second diodes $D_1$ and $D_2$, which can be seen in FIG. 5.

FIG. 6 again show the current-source circuit S of FIG. 5, but in simplified form. The circuits of the fourth and the seventh transistors $T_4$ and $T_7$ have not been modified. The eighth and the ninth transtors $T_8$ and $T_9$, however, have been replaced by a sixth diode $D_6$ which, via a fourth resistor $R_4$ connected to the output 12 of the first current-source circuit $D_3$-$T_6$, is supplied with a current $2I_0$. If the effective surface area of the P-N junction of the sixth diode $D_6$ is chosen twice as large as the areas of the base-emitter junctions of the fourth and the seventh transistors $T_4$ and $T_7$, the current which flows through these two last-mentioned transistors $T_4$ and $T_7$ will be half ($I_0$) the current through the sixth diode $D_6$. The second semiconductor junction $D_2$ is now simply biased by connecting point 8 to the positive supply voltage terminal 5 via a resistsor $R_3$. For the same value $I_0$ of the bias currents in FIGS. 4, 5 and 6, the values of the various bias resistors should be selected as follows: $R_3=2R_4=R_0$.

Finally, it is to be noted that many variants of the current source circuit S in FIG. 5 are possible, for example by connecting the base-emitter junctions of the fourth, seventh, eighth and ninth transistors ($T_4$, $T_7$, $T_8$ and $T_9$) not in parallel with the fourth diode $D_4$ but in parallel with the second semiconductor junction $D_2$ and by connecting said last-mentioned junction $D_2$ to the positive supply-voltage terminal 5 via a resistor $R_3$, so that in a similar way as in the circuit of FIG. 4, again an effective negative feedback is obtained and inter alia the collector current $I_0$ of the third transistor $T_3$, and thus the base-emitter voltage of this transistor $T_3$, is maintained at a constant value.

What is claimed is:

1. A push-pull amplifier comprising a first and a second transistor of the same conductivity type, whose collector-emitter paths are included in series between the power supply terminals, the emitter electrode of the first transistor being connected to the collector electrode of the second transistor and to an output terminal, the base electrode of the first transistor being connected to an input terminal, and means being provided for driving the second transistor as a function of the drive of the first transistor, characterized in that said means comprise a measuring circuit ($D_1$-$Z_1$) between the base and emitter electrode of the first transistor ($T_1$), which measuring circuit includes a series connection of a first semiconductor junction ($D_1$) and a first impedance ($Z_1$), a control circuit ($D_2$-$Z_2$) between the base and the emitter electrode of the second transistor ($T_2$), which control circuit includes a series connection of a second semiconductor junction ($D_2$) and second impedance ($Z_2$), a current-source circuit ($I_0$) coupled to the junction of said first semiconductor junction and said first impedance for providing the quiescent current through the first and the second semiconductor junctions ($D_1$ and $D_2$) whereby when said push-pull amplifier is at rest no currents flow through said first and said second impedances, and a coupling circuit (K) for adapting the currents through the control circuit ($D_2$-$Z_2$) to those through the measuring circuit ($D_1$-$Z_1$) in such a way that in the case of a normal drive on the input terminal (3) the sum of the base-emitter voltages ($V_{be1}+V_{be2}$) of the first and the second transistors ($T_1$ and $T_2$) remains substantially constant.

2. A circuit arrangement as claimed in claim 1, characterized in that the first semiconductor junction ($D_1$) is the base-emitter junction of a third transistor ($T_3$), whose emitter (2) is connected to the current source circuit ($I_0$ or $T_7$) and whose collector is connected to an input (9) of the coupling circuit (K).

3. A circuit arrangement as claimed in claim 2, characterized in that the coupling circuit (K) comprises a current amplifier having an input current circuit (9, 2) and an output current circuit (7, 8), the input circuit (9, 2) being included in the collector circuit of the third transistor ($T_3$) and the output circuit (7, 8) being connected to the control circuit ($D_2$-$Z_2$).

4. A circuit arrangement as claimed in claim 1 2 or 3, characterized in that the coupling circuit (K) comprises a current mirror ($D_3$, $T_6$) having an input (9) and an output (8), of which the input (9) is connected to the collector of the third transistor ($T_3$) and of which the output (8) is connected to the base (8) of a fourth transistor ($T_4$), the second semiconductor junction ($D_2$) being connected in parallel with the base-emitter junction of the fourth transistor ($T_4$) and the second impedance ($Z_2$) being included between the base (8) and the collector electrode (7) of the fourth transistor ($T_4$), whose collector (7) is also connected to the current source circuit ($I_0$).

5. A circuit arrangement as claimed in claim 4, characterized in that the current source circuit comprises a current source ($I_0$) between the emitter (2) of the third transistor ($T_3$) and the collector (7) of the fourth transistor ($T_4$).

6. A circuit arrangement as claimed in claim 4, characterized in that the current source circuit comprises a transistor ($T_7$), whose collector is connected to the emitter (2) of the third transistor ($T_3$) and whose base-emitter junction is connected in parallel with the base-emitter junction of the fourth transistor ($T_4$), and a resistor ($R_0$) which connects the collector (7) of the fourth transistor ($T_4$) to the positive supply voltage terminal (5).

7. A circuit arrangement as claimed in claim 3, characterized in that the current amplifier comprises a current mirror ($D_3$-$T_6$) having an input (9) and an output, an additional transistor ($T_5$), whose emitter is connected to the input (9) of the current mirror ($D_3$-$T_6$), whose base is connected to the output of the current mirror ($D_3$-$T_6$), and whose collector (7) is connected to the control circuit ($D_2$-$Z_2$), and a current source circuit ($T_4$, $T_8$, $T_9$, ...) for the quiescent currents through the current mirror ($D_3$-$T_6$).

8. A circuit arrangement as claimed in claim 7, characterized in that the second semiconductor junction ($D_2$) is included between the second inpedance ($Z_2$) and the emitter (10) of the second transistor ($T_2$), that the connection point (8) of the second impedance ($Z_2$) and the second semiconductor junction ($D_2$) is connected to a current source ($I_0$) for the quiescent current through the second semiconductor junction ($D_2$), and that the base of the second transistor ($T_2$) is connected to the collector (7) of the additional ($T_5$) and a current source ($I_0$ or $T_4$).

9. A circuit arrangement as claimed in claim 8, characterized in that the collector of the third transistor ($T_3$) is connected both to the input (9) of the coupling circuit (K) via a resistor (R), and to the base (7) of the second transistor ($T_2$) via a capacitor (C).

* * * * *